United States Patent [19]

Uenishi et al.

[11] Patent Number: 4,894,311

[45] Date of Patent: Jan. 16, 1990

[54] POSITIVE-WORKING PHOTORESIST COMPOSITION

[75] Inventors: Kazuya Uenishi; Yasumasa Kawabe; Tadayoshi Kokubo, all of Shizuoka, Japan

[73] Assignee: Fuji Photo Film Co., Ltd., Kanagawa, Japan

[21] Appl. No.: 113,951

[22] Filed: Oct. 29, 1987

[30] Foreign Application Priority Data

Oct. 29, 1986 [JP] Japan .................. 61-257525

[51] Int. Cl.$^4$ ............... G03C 1/54; G03C 1/60
[52] U.S. Cl. ..................... 430/192; 430/191; 430/193; 430/326; 430/331; 534/556; 534/557
[58] Field of Search ............... 430/192, 193; 534/556, 534/557

[56] References Cited

U.S. PATENT DOCUMENTS

| 3,046,118 | 7/1962 | Schmidt | 430/193 |
| 3,106,465 | 10/1963 | Naugebauer et al. | 430/193 |
| 3,148,983 | 9/1964 | Endermann et al. | 430/193 |
| 3,802,885 | 4/1974 | Lawson et al. | 430/192 |
| 4,499,171 | 2/1985 | Hosaka et al. | 430/193 |
| 4,725,523 | 2/1988 | Miura et al. | 430/192 |
| 4,738,915 | 4/1988 | Komine et al. | 430/193 |

FOREIGN PATENT DOCUMENTS

| 938233 | 1/1956 | Fed. Rep. of Germany |  |
| 1118606 | 1/1959 | Fed. Rep. of Germany | 430/193 |
| 1053866 | 1/1967 | United Kingdom | 430/193 |

OTHER PUBLICATIONS

English Translation of Japanese Publication No. 60-121445, published, 6/28/85 (Hosaka et al.)

Primary Examiner—Charles L. Bowers, Jr.
Attorney, Agent, or Firm—Sughrue, Mion, Zinn, Macpeak & Seas

[57] ABSTRACT

A positive-working photoresist composition containing an alkali-soluble novolak resin and a photosensitive compound represented by the formula

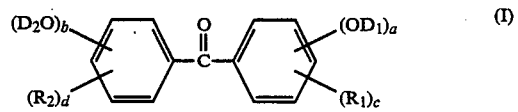

(I)

wherein $D_1$ and $D_2$, which may be the same or different, each represents a 1,2-naphthoquinonediazido-5-sulfonyl group or a 1,2-naphthoquinonediazido-4-sulfonyl group; $R_1$ and $R_2$, which may be the same or different, each represents an alkoxy group, or an alkyl ester group; and a, b, c, and d each is 0 or an integer from 1 to 5, provided that $(a+b) \geq 1$ and $(c+d) \geq 1$.

The photoresist composition is excellent in sensitivity and resolving power and forms a resist pattern having good sectional shape and high heat resistance on, for example, a semiconductor. The photoresist composition is also applicable for forming a resist pattern having a line width of less than 1 μm.

8 Claims, No Drawings

POSITIVE-WORKING PHOTORESIST COMPOSITION

FIELD OF THE INVENTION

This invention relates to a positive-working (photosensitive resist, and more particularly to a photoresist composition for fine photofabrication having high resolving power and sensitivity, and giving good sectional shapes of patterns.

BACKGROUND OF THE INVENTION

As a positive-working photoresist composition (hereinafter referred to as a "photoresist"), a composition containing an alkali-soluble resin and a naphthoquinone diazide compound as a photosensitive material is generally used. For example, novolak phenol resin/naphthoquinone diazide-substituted compounds are described in U.S. Pat. Nos. 3,664,473, 4,115,128 and 4,173,470; and cresol-formaldehyde novolak resin/-trihydroxybenzophenone-1,1-naphthoquinone diazosulfonic acid esters are described in L. F. Thompson, *Introduction to Microlithography*, No. 219, pp. 112–121 (American Chemical Society).

Since a novolak resin as a binder for a photoresist is soluble in an aqueous alkali solution without being swelled thereby, and provides high durability or resistance to plasma etching when using the images formed therefrom as a mask for etching, the novolak resin is particularly useful for this purpose. The naphthoquinone diazide compound which is used as a photosensitive material functions as a dissolution inhibitor for reducing the alkali solubility of a novolak resin, but is decomposed by irradiation with light to form an alkali-soluble material, which acts to sharply increase the alkali solubility of a novolak resin. Thus, because of the large solubilizing change an exposure to light, the naphthoquinone diazide compound is particularly useful as a photosensitive material for a positive-working photoresist.

Many positive-working photoresist compositions containing a novolak resin and a naphthoquinone diazide series photosensitive material have been developed and practically used, with sufficient results in fabrications of line widths of up to about 1.5 μm to 2 μm.

However, in integrated circuits, the degree of integration has been greatly increased and in the production of a semiconductor base plate required for very large scale integration, etc., the fabrication of very fine patterns having a line width of less than 1 μm has been required. For such a use, a photoresist having a particularly high resolving power, a high pattern form reproducing accuracy capable of accurately reproducing an exposure mask, and a high sensitivity to permit high reproducibility has been required. Conventional positive-working photoresists described above have not satisfied these requirements.

SUMMARY OF THE INVENTION

An object of this invention is, therefore, to provide a positive-working photoresist composition particularly one suitable for producing semiconductor devices, having high resolving power.

Another objects of the invention is a positive-working photoresist composition capable of accurately reproducing mask dimensions in a wide range of the line widths of photo mask.

A further object of the invention is a positive-working photoresist composition capable of forming a resist pattern of a sectional form having a high aspect ratio in a pattern having a line width of less than 1 μm.

An additional object of the invention is a positive-working photoresist composition capable of forming a pattern having a cross section with a side wall that is almost vertical.

Yet another object of the present invention is a positive-working photoresist composition having a wide development latitude.

A still further object of the present invention is a positive-working photoresist composition which is soluble in a conventional resist solvent and has excellent storage stability, without forming foreign substances when it is stored for a long period of time.

An additional object of the present invention is a positive-working photoresist providing resist images having excellent heat resistance.

As the result of various investigations for attaining the above-described characteristics, it has been found that these and other objects of the present invention can be attained by a positive-working photoresist composition containing an alkali-soluble novolak resin and at least one photosensitive compound represented by formula (I):

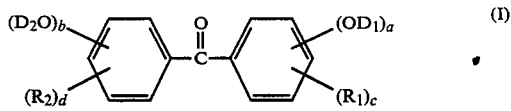

wherein $D_1$ and $D_2$, which may be the same or different, each represents a 1,2-naphthoquinonediazido-5-sulfonyl group or a 1,2-naphthoquinonediazido-4-sulfonyl group; $R_1$ and $R_2$, which may be the same or different, each represents an alkoxy group, or an alkyl ester group; and a, b, c, and d each is 0 or an integer from 1 to 5, provided that $(a+b) \geq 1$ and $(c+d) \geq 1$.

DETAILED DESCRIPTION OF THE INVENTION

The invention is explained in greater detail as follows.

In formula (I) described above, the alkoxy group represented by $R_1$ and $R_2$ is preferably an alkoxy group having from 1 to 4 carbon atoms, such as a methoxy group, an ethoxy group, a propoxy group, an isopropoxy group, an n-butoxy group, a sec-butoxy group, a t-butoxy group, etc. The alkyl ester group is preferably a group represented by R'COO—, wherein R' is preferably an alkyl group having from 1 to 4 carbon atoms such as a methyl group, an ethyl group, a propyl group, an isopropyl group, an n-butyl group, a sec-butyl group, a t-butyl group, etc.

The alkoxy group and the alkyl ester group may be substituted with a group of the formula —X—$R_3$ wherein X represents a single chemical bond,

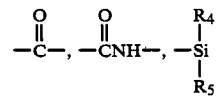

(wherein $R_4$ and $R_5$, which may be the same or different, each represents a hydrogen atom, or a substituted or unsubstituted aliphatic or aromatic hydrocarbon group) or

and R$_3$ represents a substituted or unsubstituted aliphatic or aromatic hydrocarbon group or a functional group.

More specifically, the —X—R$_3$ group includes a substituted or unsubstituted aliphatic group, a substituted or unsubstituted aromatic group, a hydroxy group, a carboxyl group, a sulfo group, an amino group, a nitro group, a silyl group, a silyl ether group, a cyano group, an aldehyde group, a mercapto group, a halogen atom, an acyl group of the formula

(wherein R$_6$ represents a substituted or unsubstituted aliphatic or aromatic group), a silyl group of the formula

(wherein R$_7$ and R$_8$, which may be the same or different, each represents a hydrogen atom, or a substituted or unsubstituted aliphatic or aromatic group, and R$_9$ represents a substituted or unsubstituted aliphatic or aromatic group), a sulfonyl group of the formula —SO$_2$—R$_{10}$ (wherein R$_{10}$ represents a substituted or unsubstituted aliphatic or aromatic group), an amido group of the formula

(wherein R$_{11}$ represents a substituted or unsubstituted aliphatic or aromatic group), etc.

In the group of formula —X—R$_3$, examples of the aliphatic group include an alkyl group, an alkenyl group, etc., and examples of the aromatic group include a phenyl group, a naphthyl group, etc. Examples of substituents for the aliphatic group include an alkoxy group, an aryloxy group, an aryl group, a hydroxy group, a carboxyl group, a sulfo group, an amino group, a nitro group, a silyl group, a silyl ether group, a cyano group, an aldehyde group, a mercapto group, a halogen atom, etc., and examples of substituents for the aromatic group include those described for the aliphatic group and, additionally, an aliphatic group.

Preferred examples of the group of the formula —X—R$_3$ include a hydroxy group, a sulfo group, an amino group, and those groups wherein R$_3$ represents a substituted or unsubstituted aliphatic group having 1 to 8 carbon atoms or a substituted or unsubstituted aromatic group having 6 to 15 carbon atoms.

Of the photosensitive materials represented by formula (I) described above, compounds in which the sum of a and b is an integer of from 2 to 5 and the sum of c and d is an integer of from 1 to 4 are preferred.

The compound represented by formula (I) is a sulfonic acid ester compound that can be obtained by condensing a substituted or unsubstituted alkoxy or alkyl ester derivative of polyhydroxybenzophenone represented by formula (II):

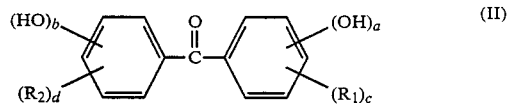

wherein R$_1$ and R$_2$, which may be the same or different, each represents an alkoxy group, or an alkyl ester group; a, b, c and d each is 0 or an integer of 1 to 5, provided that (a+b)$\geq$1; with 1,2-naphthoquinonediazido-5-sulfonyl chloride or 1,2-naphthoquinonediazido-4-sulfonyl chloride, and preferably 1,2-napthoquinonediazido-5-sulfonyl chloride.

The polyhydroxybenzophenone derivative represented by formula (II) which is used for producing the compound shown by formula (I) can be prepared according to conventional methods, including the following method comprising the conversion of the hydroxy groups.

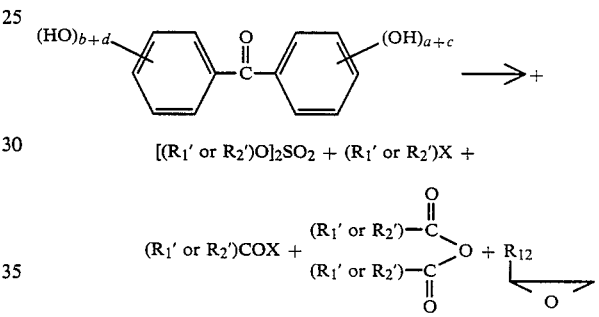

wherein R$_1'$ and R$_2'$ each represents a group represented by R$_1$ and R$_2$ in formula (II) above, R$_{12}$ represents a hydrogen atom or a substituted or unsubstituted alkyl group having 1 to 4 carbon atoms, and X represents a halogen atom.

The above reaction can be conducted as described in L. H. Klemm et al, *Journal of Organic Chemistry*, Vol. 29, p. 952 (1959) and *Organic Synthesis*, Vol. 1, p. 58, etc.

For the esterification reaction of the compound represented by formula (II) and 1,2-naphthoquinonediazido-5-sulfonyl chloride or 1,2-naphthoquinonediazido-4-sulfonyl chloride, any conventional method can be used. Also, the esterification can be carried out by referring to the method as described in U.S. Pat. Nos. 3,046,118, 3,106,465 and 3,148,983, etc. That is, the necessary amounts of the polyhydroxybenzophenone derivative represented by formula (II) and 1,2-naphthoquinonediazido-5-sulfonyl chloride or 1,2-naphthoquinonediazido-4-sulfonyl chloride are placed in a flask together with a solvent such as dioxane, acetone, methyl ethyl ketone, etc., and they are condensed by adding dropwise thereto a basic catalyst such as sodium hydroxide, sodium carbonate, sodium hydrogen carbonate, triethylamine, etc. at a temperature of from about 10° C. to about 30° C. The product obtained is washed with water, purified, and then dried, to prepare the photosensitive material represented by formula (I) described above.

Of the compounds represented by formula (I) described above, those in which (a+b) is from 2 to 5 and (c+d) is from 1 to 4 are preferred, in view of the availability of raw materials, the ease of synthesis, good sectional profiles of the resist pattern, and high sensitivity.

The alkali-soluble novolak resin for use in this invention can be a conventional alkali-soluble novolak resin and is obtained by addition-condensing 1 mol of a phenol and from 0.6 to 1.0 mol of an aldehyde in the presence of an acid catalyst.

As the phenol, phenol, o-cresol, m-cresol, p-cresol, and xylenol can be used alone or as a combination thereof.

Also, as the aldehyde, formaldehyde, p-formaldehyde, furfural, etc., can be used. Furthermore, as the acid catalyst, hydrochloric acid, sulfuric acid, formic acid, oxalic acid, acetic acid, etc., can be used.

The novolak resin obtained has a molecular weight of from about 1,000 to 50,000 (weight average) and is alkali soluble.

The mixing ratio of the photosensitive material and the alkali-soluble novolak resin in this invention is from about 5 to 100 parts by weight, and preferably from about 10 to 50 parts by weight of the photosensitive material to 100 parts by weight of the novolak resin. If the amount of the photosensitive material is less than about 5 parts by weight, the film residual ratio is greatly reduced and if the amount if over about 100 parts by weight, the sensitivity of the photoresist and the solubility thereof in solvent are reduced.

In this invention, the above-described photosensitive material is mainly used but, if desired, a conventional photosensitive material such as an ester compound of 2,3,4-trihydroxybenzophenone, 2,4,4'-trihydroxybenzophenone, 2,4,6-trihydroxybenzophenone, etc., and 1,2-naphthoquinone-diazido-5-sulfonyl chloride can be used in combination with the compound according to formula (I). In this case, the amount of the ester compound is less than about 100 parts by weight, and preferably less than about 30 parts by weight per 100 parts by weight of the photosensitive material represented by formula (I).

The photoresist composition of this invention can further contain a polyhydroxy compound as a dissolution accelerator in developer. Preferred examples of the polyhydroxy compound are phenols, resorcine, fluoroglycine, 2,3,4-trihydroxybenzophenone, 2,3,4,4'-tetrahydroxybenzophenone, acetone-pyrogallol condensed resins, etc.

Solvents for dissolving the photosensitive material and the alkali-soluble novolak resin of this invention, include ketones such as methyl ethyl ketone, cyclohexanone, etc., alcohol ethers such as ethylene glycol monomethyl ether, ethylene glycol monoethyl ether, etc., ethers such as dioxane, ethylene glycol dimethyl ether, etc., cellosolve esters such as methylcellosolve acetate, ethylcellosolve acetate, etc., fatty acid esters such as butyl acetate, methyl lactate, ethyl acetate, etc., halogenated hydrocarbons such as 1,1,2-trichloroethylene, etc., and high polar solvents such as dimethylacetamide, N-methylpyrrolidone, dimethylformamide, dimethyl sulfoxide, etc. These solvents may be used alone or as a mixture thereof.

The positive-working photoresist composition of this invention can further contain, if desired, dyes, plasticizers, adhesion assistants, surface active agents, etc. Practical examples thereof are dyes such as Methyl Violet, Crystal Violet, Malachite Green, etc., plasticizers such as stearic acid, acetal resins, phenoxy resins, alkyd resins, etc., adhesives such as hexamethyldisilazane, chloromethylsilane, etc., and surface active agents such as nonylphenoxy poly(ethyleneoxy) ethanol, octylphenoxy poly(ethyleneoxy) ethanol, etc.

The positive-working photoresist composition of this invention described above is coated on a base plate (e.g., silicone having a silicon dioxide coating or layer), such as a material which is used for the production of a precise integrated circuit element, by any suitable conventional coating method such as a spin coating method, a roll coating method, etc.; the photoresist layer thus formed is light-exposed through a mask, and then developed to provide a good resist pattern.

Typically, the positive-working photoresist of this invention is coated on a semiconductor wafer or other base plate such as glass, ceramic, metal, etc., by a spin coating method of a roller coating method at a thickness of from about 0.5 $\mu$m to 3 $\mu$m. Thereafter, the resist layer thus formed is dried by heating; a circuit pattern, etc., is printed thereon by ultraviolet light through an exposure mask; and then the resist layer is developed to provide a positive image. Furthermore, by etching the base plate using the positive image as a mask, a pattern can be applied to the base plate. Typical application fields include the production of semiconductor elements such as integrated circuits (IC), etc., the production of circuit base plates such as liquid crystals, thermal heads, etc., and other photofabrication steps.

As the developer, any conventional aqueous solution of an alkali can be used and examples of the alkali include inorganic alkalis such as sodium hydroxide, potassium hydroxide, sodium carbonate, sodium silicate, sodium metasilicate, sodium silicate, sodium metasilicate, aqueous ammonia, etc.; primary amines such as ethylamine, n-propylamine, etc.; secondary amines such as ethylamine, n-propylamine, etc.; tertiary amines such as triethylamine, methyldiethylamine, etc.; alcohol amines such as dimethylethanolamine, triethanolamine, etc.; quaternary ammonium salts such as tetramethylammonium hydroxide, tetraethylammonium hydroxide, etc.; and cyclic amines such as pyrrole, piperidine, etc. Furthermore, the above-described aqueous alkali solution may contain an alcohol, a surface active agent, etc.

The positive-working photoresist composition of this invention contains a photosensitive compound having no hydroxy group in the benzophenone nucleus, and containing an alkoxy group, or an alkyl ester group. Accordingly, the positive-working photoresist of this invention is excellent in high resolving power, faithful reproduction property, sectional shape of resist images, development latitude, and heat resistance as compared with a conventional positive-working photoresist, containing a photosensitive material obtained by esterifying some or all of the hydroxy groups of polyhydroxybenzophenone with 1,2-naphthoquinonediazido-5-sulfonyl chloride or 1,2-naphthoquinonediazido-4-sulfonyl chloride. Furthermore, a solution of the positive-working photoresist of this invention dissolved in an ordinary solvent is excellent in storage stability for a long period of time.

The invention is now explained in greater detail by reference to the following specific examples, although the invention is not to be construed as being limited to these examples. Unless otherwise indicated, all parts, ratios and percents are by weight.

EXAMPLES 1 TO 4

I. Synthesis of Photosensitive Materials and Alkali-Soluble Novolak Resins (1) Synthesis of Photosensitive Material (a):

In a three-necked flask were placed 20 g of 2,3,4,4'-tetrahydroxybenzophenone, 9 g of sodium hydroxide, and 200 ml of distilled water and then mixture was stirred to form a solution. Then, 8.5 g of diethyl sulfate was added dropwise to the solution at room temperature (25° C.), after which the temperature was raised to 95° C. to 96° C. to complete the reaction. After the reaction was over, the reaction mixture obtained was added dropwise to an aqueous hydrochloric acid solution and the product thus precipitated was separated by filtration and dried under reduced pressure. The product was further purified by column chromatography to obtain 15 g of a compound in which one hydroxy group has been modified to an ethoxy group (containing position isomers thereof).

In a three-necked flask were place 10 g of the compound thus obtained, 35 g of 1,2-naphthoquinonediazido-5-sulfonyl chloride, and 250 ml of acetone, and the mixture was stirred to provide a uniform solution. Then, a mixture of 13.2 g of triethylamine and 70 ml of acetone was gradually added dropwise to the solution, which was then reacted for 3 hours at room temperature. After completion of the reaction, the reaction mixture was added dropwise to a 1% aqueous hydrochloric acid solution, and the precipitate thus formed was recovered by filtration, washed with methanol, and dried to obtain 38 g of an ethoxy-modified photosensitive material which was designated as Photosensitive Material (a).

(2) Synthesis of Photosensitive Material (b):

In a three-necked flask were placed 20 g of 2,3,4,4'-tetrahydroxybenzophenone and 400 ml of acetone, and the mixture was stirred to form a solution. Then, 80 ml of distilled water, 18.8 g of diethyl sulfate and 12.3 g of triethylamine were added to the solution at room temperature, and the mixture was reacted while refluxing for 3 hours. After completion of the reaction, the reaction mixture was cooled to room temperature and adjusted to a pH of 7.0 with 36% hydrochloric acid. NMR analysis of the reaction mixture showed that 1.3 hydroxy group (an average) per molecule has been converted into an ethoxy group. To the reaction mixture was then added 59 g of 1,2-naphthoquinonediazido-5-sulfonyl chloride, and the mixture was stirred to form a solution. Then, a mixture of 22.2 g of triethylamine and 140 ml of acetone was added dropwise to the solution, which was reacted for 3 hours at room temperature. The reaction mixture was added dropwise to an aqueous 1% hydrochloric acid solution, and the precipitated thus formed was separated by filtration, washed with water and then with methanol, and dried to obtain 68 g of an ethoxy-modified photosensitive material which was designated as Photosensitive Material (b).

(3) Synthesis of Photosensitive Material (c):

In a three-necked flask were placed 20 g of 2,3,4,4'-tetrahydroxybenzophenone and 400 ml of acetone, and then the mixture was stirred to form a solution. After 12.4 g of acetic anhydride was added thereto at room temperature, a mixture of 12.3 g of triethylamine and 200 ml of acetone was added dropwise to the solution, followed by allowing the mixture to react. After completion of the reaction, the reaction mixture was adjusted to a pH of 7.0 with 36% hydrochloric acid. NMR analysis of the reaction mixture showed that 1.4 hydroxy group (an average) per molecule has been converted into a methyl ester group. To the reaction mixture was then added 57 g of 1,2-naphthoquinonediazido-5-sulfonyl chloride, and the mixture was stirred to form a solution. Then, a mixture of 21.5 g of triethylamine and 150 ml of acetone was added dropwise to the solution, which was reacted for 3 hours at room temperature. The reaction mixture was added dropwise to an aqueous 1% hydrochloric acid solution, and the precipitate thus formed was separated by filtration, washed with water and then with methanol, and dried to obtain 70 g of a methyl ester-modified photosensitive material which was designated as Photosensitive Material (c).

(4) Synthesis of Photosensitive Material (d):

In a three-necked flask were placed 20 g of 2,3,4,4'-tetrahydroxybenzophenone, 50 ml of dimethylsulfoxide and 2 g of triethylamine, and the mixture was stirred to form a solution. The temperature of the solution was elevated to 90° C, and 7 g of ethylene oxide was blown into the solution thereby reacting the mixture for a period of 2 hours. After completion of the reaction, the reaction mixture was cooled to room temperature and adjusted to a pH of 7.0 with 36% hydrochloric acid. NMR analysis of the reaction mixture showed that 1.6 hydroxy group (an average) per molecule has been converted into a hydroxyethyl group. To the reaction mixture was then added 53 g of 1,2-naphthoquinonediazido-5-sulfonyl chloride, and the mixture was stirred to form a solution. Then, a mixture of 20 g of triethylamine and 150 ml of acetone was added dropwise to the solution, which was reacted for 3 hours at room temperature. After completion of the reaction, the reaction mixture was added dropwise to an aqueous 1% hydrochloric acid solution, and the precipitate thus formed was separated by filtration, washed with water and then with methanol, and dried to obtain 64 g of a hydroxyethoxy-modified photosensitive material which was designated as Photosensitive Material (d).

(5) Synthesis of Photosensitive Material (i):

In a three-necked flask were placed 20 g of 2,3,4-tetrahydroxybenzophenone, 37.8 g of 1,2-naphthoquinonediazido-5-sulfonyl chloride and 400 ml of acetone, and the mixture was stirred to form a solution. Then, a mixture of 14.2 g of triethylamine and 150 ml of acetone was added dropwise to the solution, and the mixture was reacted for 3 hours at room temperature. After completion of the reaction, the reaction mixture was added dropwise to a 1% aqueous hydrochloric acid solution, and the precipitate thus formed was separated by filtration, washed with water, and dried to obtain 46 g of 1,2-naphthoquinonediazido-5-sulfonyl acid ester of 2,3,4-trihydroxybenzophenone which was designated as Photosensitive Material (i).

(6) Synthesis of Photosensitive Material (ii):

In a three-necked flask were placed 20 g of 2,3,4-trihydroxybenzophenone, 63 g of 1,2-naphthoquinonediazido-5-sulfonyl chloride and 400 ml of acetone, and the mixture was stirred to form a solution. Then, a mixture of 23.7 g of triethylamine and 150 ml of acetone was added dropwise to the solution, and the mixture was reacted for 3 hours at room temperature. After completion of the reaction, the reaction mixture was added dropwise to a 1% aqueous hydrochloric acid solution, and the precipitate thus formed was separated by filtration, washed with water, and dried to obtain 69 g of 1,2-naphthoquinonediazido-5-sulfonic acid ester of 2,3,4-trihydroxybenzophenone which was designated as Photosensitive Material (ii).

(7) Synthesis of Photosensitive Material (iii):

In a three-necked flask were placed 20 g of 4'-methoxy-2,3,4-trihydroxybenzophenone, 55.8 g of 1,2-naphthoquinonediazido-5-sulfonyl chloride and 400 ml of acetone, and the mixture was stirred to form a solution. Then, a mixture of 21 g of triethylamine and 150 ml of acetone was added dropwise to the solution, and the mixture was reacted for 3 hours at room temperature. After completion of the reaction, the reaction mixture was added dropwise to a 1% aqueous hydrochloric acid solution, and the precipitate thus formed was separated by filtration, washed with water, and dried to obtain 62 g of 1,2-naphthoquinonediazido-5-sulfonic acid ester of 4'-methoxy-2,3,4-trihydroxybenzophenone which was designated as Photosensitive Material (iii).

(8) Synthesis of Novolak Resin (I):

In a three-necked flask were placed 70 g of m-cresol, 30 g of p-cresol, 54.0 g of an aqueous 37% formalin solution, and 0.05 g of oxalic acid, and the temperature of the mixture was raised to 100° C. with stirring to perform a reaction for 7 hours. After the reaction was over, the reaction mixture was cooled to room temperature and the pressure in the flask was reduced to 30 mmHg. Then, the temperature of the system was gradually raised to 150° C. to remove water and unreacted monomers. The weight average molecular weight of the novolak resin thus obtained was 15,000 (calculated as polystyrene). The resulting novolak resin was designated as Novolak Resin (I).

(9) Synthesis of Novolak Resin (II):

In a three-necked flask were placed 40 g of m-cresol, 60 g of p-cresol, 49.5 g of an aqueous 37% formalin solution, and 0.05 g of oxalic acid, and the temperature of the mixture was raised to 100° C. with stirring to perform a reaction for 7 hours. After the reaction was over, the reaction mixture was cooled to room temperature and the pressure in the flask was reduced to 30 mmHg. Then, the temperature of the system was gradually raised to 150° C. to remove water and unreacted monomers. The weight average molecular weight of the novolak resin thus obtained was 8,000 (calculated as polystyrene).

II. Preparation and Evaluation of Positive-Working Photoresist Composition:

In 15 g of ethylcellosolve acetate were dissolved 1.25 g of the photosensitive material and 5 g of the alkali-soluble novolak resin as shown in Table 1 below, and the solution was filtered using a micro filter of 0.2 μm mesh to obtain a photoresist composition.

The photoresist was coated on a silicon wafer using a spinner and dried in a convection oven under a nitrogen gas atmosphere for 30 minutes at 90° C. to form a resist film having a film thickness of 1.5 μm. The surface of the photoresist film was light-exposed with a transparency using a reduction projector (NSR 1505G, trade name, made by Nippon Kogaku K.K.), developed using a 2.38% aqueous solution of tetramethylammonium hydroxide for one minute, washed with water for 30 seconds, and then dried. Then, by observing the resist pattern on the silicon wafer thus obtained by means of a scanning type electron microscope, the resist was evaluated. The results are shown in Table 2 below.

The sensitivity shown in the Table is defined as the reciprocal of the exposure amount reproducing a mask pattern of 2.0 μm, and is shown as a relative value based on the sensitivity of Comparison Example 1 (=1.0).

The film residual ratio is shown as the percentage of the ratio of the thicknesses of the unexposed portion before and after the development. The resolving power is shown as the limiting resolving power in an exposure amount reproducing a mask pattern of 2.0 μm.

The heat resistance in the Table is shown as a temperature causing no deformation of the resist pattern after baking the silicon wafer having the resist pattern formed thereon in a convection oven for 30 minutes.

The shape of the resist is shown as the angle (θ) formed by the wall face of the resist in the cross section of the resist pattern of 1.0 μm and the surface plane of the silicon wafer.

From the results shown in Table 2 below, it can be seen that the resist using the photosensitive material provided by the present invention was excellent, particularly in resolving power and the shape of the resist as compared with the resist composition using a conventional photosensitive material having a hydroxyl group. The photosensitive material according to this invention was also excellent in solubility in, ethylene glycol monoethyl ether acetate. When a solution of the resist composition using the photosensitive material was allowed to stand for 30 days at 23° C, no precipitates formed. In Comparative Example 1, when the photoresist composition was allowed to stand for 30 days at 23° C., no precipitates formed but, the precipitate was formed in Comparative Examples 2 and 3.

TABLE 1

| Example No. | Photosensitive Material | Esterification Ratio (%)* | Alkali-soluble Resin |
|---|---|---|---|
| Example 1 | (a) Ethoxy-modified photosenstive material | 100 | (I) |
| Example 2 | (b) Ethoxy-modified photosensitive material | 100 | (II) |
| Example 3 | (c) Methyl ester-modified photosensitive material | 100 | (II) |
| Example 4 | (d) Hydroxyethoxy-modified photosensitive material | 100 | (II) |
| Comparative Example 1 | (i) 2,3,4-Trihydroxybenzophenone-1,2-naphthoquinonediazido-5-sulfonic acid ester | 54 | (II) |
| Comparative Example 2 | (ii) 2,3,4-Trihydroxybenzophenone-1,2-naphthioquinonediazido-5-sulfonic acid ester | 90 | (II) |
| Comparative Example 3 | (iii) 4'-Methoxy-2,3,4-trihydroxybenzophenone-1,2-naphthoquinonediazido- | | |

TABLE 1-continued

| Example No. | Photosensitive Material | Esterification Ratio (%)* | Alkali-soluble Resin |
|---|---|---|---|
| | 5-sulfonic acid ester | 71 | (II) |

*Esterification ratio is expressed in terms of a percent ratio of the groups esterified with 1,2-naphthoquinonediazido-4- and/or -5-sulfonyl chloride to the remaining unmodified hydroxy groups per molecule of the compound.

TABLE 2

| Example No. | Photo-Sensitive Material | Relative Sensitivity | Film Residual Ratio (%) | Resolving Power (μm) | Heat Resistance (°C.) | Shape (θ) of Resist |
|---|---|---|---|---|---|---|
| 1 | (a) | 1.1 | 99 | 0.7 | 150 | 86 |
| 2 | (b) | 1.3 | 99 | 0.7 | 150 | 87 |
| 3 | (c) | 1.2 | 99 | 0.7 | 150 | 87 |
| 4 | (d) | 1.1 | 99 | 0.7 | 150 | 85 |
| Comparative Example 1 | (i) | 1.0 | 97 | 0.9 | 140 | 78 |
| Comparative Example 2 | (ii) | 1.1 | 98 | 0.8 | 140 | 83 |
| Comparative Example 3 | (iii) | 1.1 | 96 | 0.9 | 140 | 80 |

While the invention has been described in detail and with reference to specific embodiments thereof, it will be apparent to one skilled in the art that various changes and modifications can be made therein without departing from the spirit and scope thereof.

What is claimed is:

1. A positive-working photoresist composition for fine photofabrication comprising an alkali-soluble novolak resin in admixture with at least one photosensitive compound represented by formula (I)

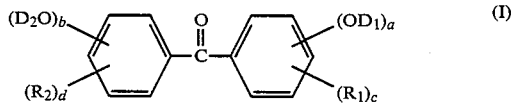

wherein $D_1$ and $D_2$, which may be the same or different, each represents a 1,2-naphthoquinonediazido-5-sulfonyl group or a 1,2-naphthoquinonedizido-4-sulfonyl group; $R_1$ and $R_2$, which may be the same or different, each represents an alkoxy group, or an alkyl ester group, and a, b, c, and d each is 0 or an integer from 1 to 5, provided that $(a+b) \geq 1$ and $(c+d) \geq 1$, wherein said resin and said photosensitive compound are present in sufficient amounts to provide a positive resist pattern.

2. The photoresist composition as claimed in claim 1, wherein said alkoxy group contains from 1 to 4 carbon atoms; and said alkyl ester group is represented by R'COO—, wherein R' represents an alkyl group having from 1 to 4 carbon atoms.

3. The photoresist composition as claimed in claim 1, wherein $(a+b)$ is an integer of from 2 to 5, and $(c+d)$ is an integer of from 1 to 4.

4. The photoresist composition as claimed in claim 1, wherein $D_1$ and $D_2$ each represents 1,2-naphthoquinonediazido-5-sulfonyl chloride.

5. The photoresist composition as claimed in claim 1, wherein said novolak resin is a phenolaldehyde resin comprising a phenol selected from the group consisting of phenol, o-cresol, m-cresol, p-cresol, and xylenol and an aldehyde selected from the group consisting of formaldehyde, p-formaldehyde, and furfural.

6. The photoresist composition as claimed in claim 1, comprising from about 5 to 100 parts by weight of said photosensitive compound per 100 parts by weight of said novolak resin.

7. The photoresist composition as claimed in claim 6, comprising from about 10 to 50 parts by weight of said photosensitive compound per 100 parts by weight of said novolak resin.

8. A photoresist for fine photofabrication comprising a base plate having thereon a photosensitive layer containing a positive-working photoresist composition containing an alkali-soluble novolak resin in admixture with at least one compound represented by formula (I)

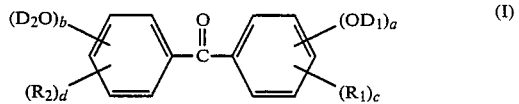

wherein $D_1$ and $D_2$, which may be the same or different, each represents a 1,2-naphthoquinonediazido-5-sulfonyl group or a 1,2-naphthoquinonediazido-4-sulfonyl group; $R_1$ and $R_2$, which may be the same or different, each represents an alkoxy group, or an alkyl ester group; and a, b, c and d each is 0 or an integer from 1 to 5, provided that $(a+b) \geq 1$ and $(c+d) \geq 1$, wherein said resin and said photosensitive compound are present in sufficient amounts to produce a positive resist pattern.

* * * * *